United States Patent [19]
Bossi

[11] 3,753,074
[45] Aug. 14, 1973

[54] PARALLEL CONNECTION OF SURGE VOLTAGE-RESISTANT SEMICONDUCTOR ELEMENTS SUCH AS DIODES THYRISTORS HAVING DIFFERING AVALANCHE VOLTAGE

[75] Inventor: Han Jürg Bossi, Nussbaumen, Switzerland

[73] Assignee: Aktiengesellschaft Brown, Boveri & Cie, Baden, Switzerland

[22] Filed: Feb. 10, 1969

[21] Appl. No.: 797,992

[52] U.S. Cl. ........................ 321/11, 321/27, 317/43
[51] Int. Cl. ........................................... H02m 1/18
[58] Field of Search .......................... 321/8, 11, 27; 307/32, 317, 93; 317/43

[56] References Cited

UNITED STATES PATENTS 2,813,243 11/1957 Christian et al. ................ 321/27 X
3,210,636 10/1965 Kaiser et al. ........................... 321/8
3,356,925 12/1967 Brandt et al. ..................... 321/27 X

OTHER PUBLICATIONS

RCA Silicon Power Circuits Manual, pp. 24–27, Copyright 1967.

*Primary Examiner*—William H. Beha, Jr.
*Attorney*—Pierce, Scheffler and Parker

[57] ABSTRACT

A plurality of silicon semiconductor components such as diodes and thyristors are connected in parallel to a source of alternating voltage for purposes of rectification. To reduce the stress on the semiconductor components and eliminate the need for wiring capacitors in parallel with the semiconductor components, the component which exhibits the highest avalanche voltage characteristic is placed in the circuit where passage of current in the forward direction through the semiconductor components has its lowest value.

1 Claim, 2 Drawing Figures

Figure 1:
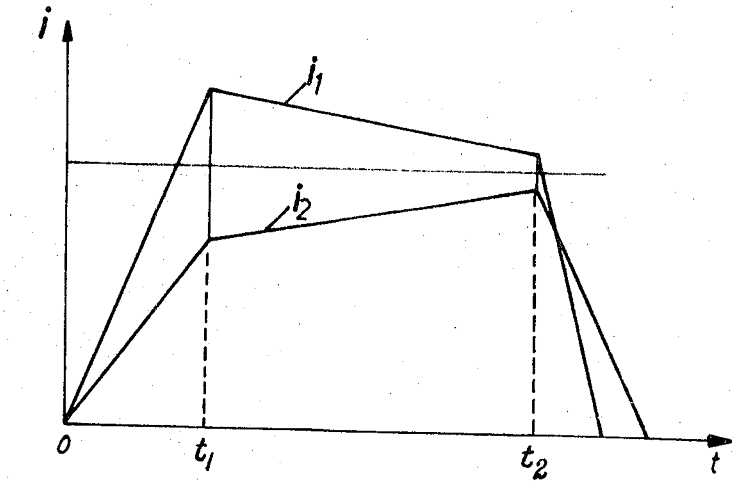

Inventor
Hans Jürg Bossi

By Pierce, Scheffler & Parker
Attorneys

Inventor
Hans Jürg Bossi

By Prime, Schiffler & Parker
Attorneys

PARALLEL CONNECTION OF SURGE VOLTAGE-RESISTANT SEMICONDUCTOR ELEMENTS SUCH AS DIODES THYRISTORS HAVING DIFFERING AVALANCHE VOLTAGE

The present invention relates to an improved arrangement for connecting surge voltage-resistant semiconductor elements in parallel — in particular silicon diodes and thyristors — having inherently different avalanche voltages.

For supplying large rectifier installations with current, for instance electrolysis and stationary traction systems, it is now customary to use electronic rectifier elements inclusively, these being in the form of silicon diodes or thyristors.

Silicon diodes and thyristors have certain peculiarities which must be considered if they are to be used in heavy current rectifier installations. In accordance with the purpose for which it is intended to be used, a silicon diode or thyristor when biased to block current should allow practically no current to pass through (i.e. a very small current). This condition is fulfilled by semiconductor rectifiers only to a certain limit value of the inverse voltage which frequently varies from element to element, whilst if this limit value is exceeded a sudden, strong flow of current occurs. The physical mechanism of this known "avalanche" effect will not be gone into in detail here, but the conditions are quite comparable to the processes in the ignition, i.e. ionization of gaseous discharge gaps. With the use of silicon diodes and thyristors, in this connection, because of the thermal influences which are always present, free charge carriers (positive "holes," i.e. residual atoms the positive atomic charges of which take effect because of the lack of one or more electrons in their shell) are accelerated by the strong electric field in the current blocking direction to such high energy that they can "strike out" free charge carriers from the lattice-like crystal structure of the semiconductor. These charge carriers are themselves accelerated and free further charge carriers and so on. There is accordingly a quasi-exponential increase of the free charge carriers, and this multiplication of carriers finally leads to the "avalanche breakdown," in which via the pn junction of the diode, biased in the current blocking direction, considerable currents can flow because of the charge transport effected by the free carriers.

Particular account must be taken of this effect in the use of silicon diodes and thyristors for purposes of rectifying alternating voltages. Accordingly, to prevent an avalanche breakdown, as far as possible, silicon semiconductor elements having high avalanche voltages must be used; on the other hand, these elements must be arranged in such a way that they are not damaged even upon temporarily exceeding the avalanche voltage, by the breakdown current which then occurs.

Surge voltage-resistant diodes, for example, obtainable on the market at the present time are designed to withstand periodic peak inverse voltages up to 2,600V. Strictly speaking they should be periodically loaded to their avalanche voltage.

In large scale installations, surge voltage resistant diodes should not, however, take over alone the excess voltage protection. In this connection, to avoid overloading the individual diodes, a good current distribution in the backward direction would be necessary, which, again, makes it necessary to have expensive pieces of equipment. It is, however, possible to get around this by the use of relatively simple surge diverters on the secondary side of the rectifier transformer.

Excess voltage protection is also necessary against what are called carrier dynamic overvoltages. On sudden reversal of the potential biasing a diode in the forwards i.e. current passage direction, the free charge carriers still present in the pn boundary layer cannot immediately flow away, so that for a short period a current i.e. reverse current, can still flow in the current blocking direction, which, as a result of the "suctioning effect" of the charge carriers, rapidly drops to the very small static inverse current. By this sudden alteration in current i.e. carrier storage effect or "hole storage," a high voltage occurs at the inductances of the circuit which must be limited to a permissible value by a short circuiting of the element.

If many silicon diodes connected in parallel are used, there is, when commutation takes place, a grading in time of the cut-off of the reverse currents. In this connection, the current distribution, since differences in the forward conductance voltage voltage drop play only a subordinate role, is determined in the first place by the inductive conditions, which obviously have particular influence when the current change is greatest, i.e. during the commutation period when the diodes are being turned on or off.

As protection against carrier dynamic over-voltages, the individual silicon diodes can be connected to capacitors, which at the moment of the cut off of the reverse current "short circuit" the overvoltages. As a result of the above mentioned grading in time of the current cut off, it is, however, uneconomical to apportion a capacitor to each diode, or to use a suitably large capacitor common to all diodes and wired in parallel therewith. The diodes which are still carrying current act in fact as wiring (i.e. short circuit) for the elements last to cut off, so that, for the common wiring it sufficies to use a small capacitor and to arrange it where the diodes which are last to cut off are located. It must be clear, however, that these are the diodes which in the forwards direction have the smallest mean current, so that it suffices to ascertain by measurement the minimum current distribution in the forwards direction, and at this place to arrange the common wiring capacitor, as disclosed in my co-pending application Ser. No. 708,368, filed Feb. 26, 1968.

It was previously assumed that generally speaking, in the case of surge voltage-resistant diodes, on account of the above mentioned inductive influence of the lines, the short-circuiting capacitors can be dispensed with only when no parallel circuitry of the semiconductor components is involved i.e. with a series circuit.

The present invention provides a way of managing without these capacitors also in the case of a parallel circuit of semiconductor diodes, or other similar semiconductor circuit components, which in the current blocking range have an avalanche break down, for instance thyristors and of economizing in this way on the not inconsiderable expenditure for capacitor and associated safety device, with its assembly.

SUMMARY OF THE INVENTION

The desired objective, i.e. of eliminating the need for capacitors wired in parallel with the semiconductor components to reduce the stress on the components in the case where the semiconductor components are connected in parallel branches to the source of alternating voltage, is obtained by determining the current distribution in the several branches and by so arranging the individual semiconductor components in the branches of the parallel circuit that the component which has the highest avalanche voltage, i.e. a component in which the backwards current cuts off last during the turn-off period is placed in that branch of the circuit where the passage current i.e. the current in the forward direction has its lowest mean value.

The invention accordingly makes use of the circumstance mentioned above that it is possible in the case involving use of many semiconductor components of the silicon type having inherently different avalanche voltages to foretell in which of the components the backwards current cuts off last, i.e. which component has the highest avalanche voltage.

Figure 2:
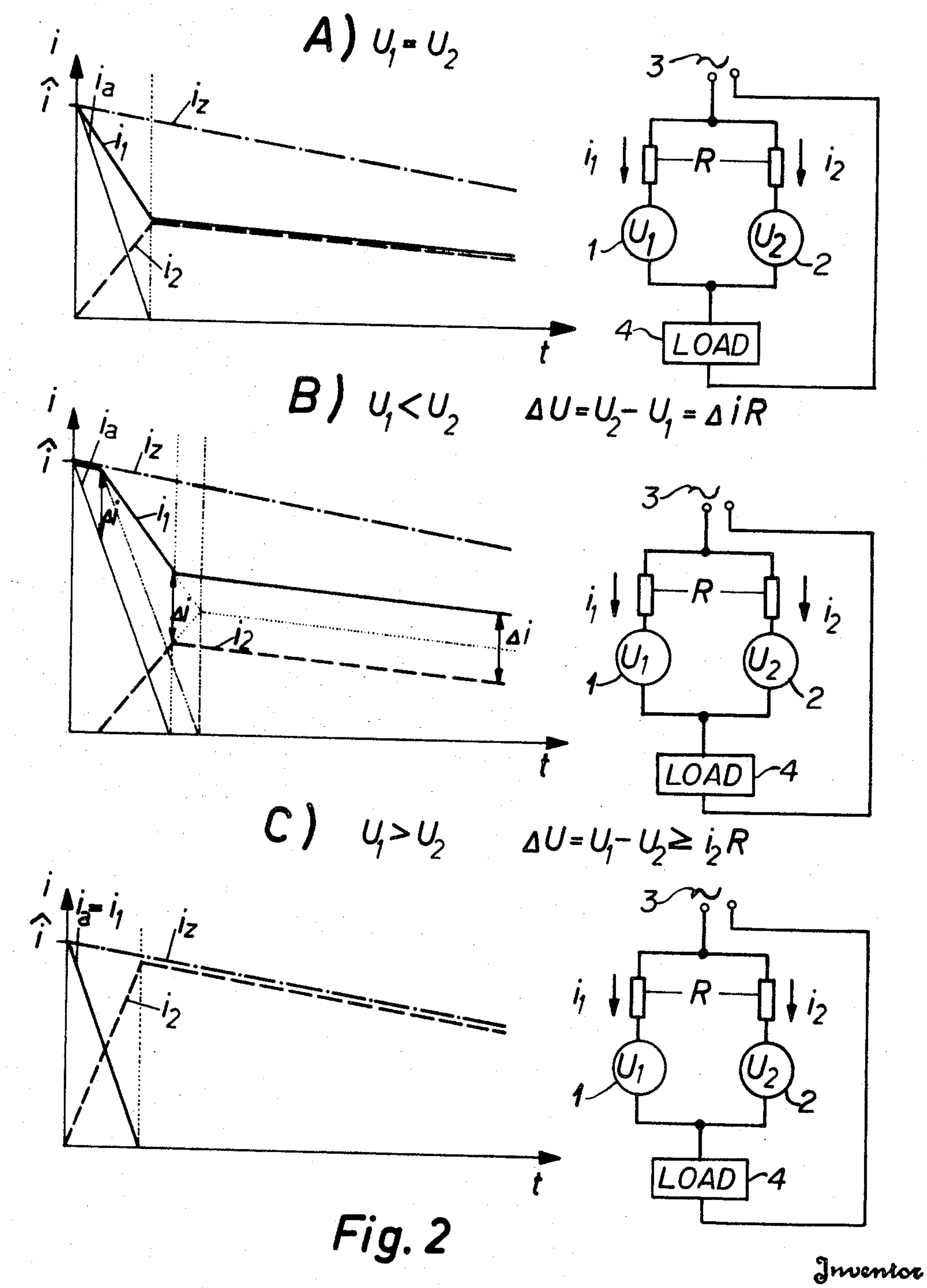

In the accompanying drawings which have been provided to illustrate the invention:

FIG. 1 is a graph showing in general the current flows in two silicon diodes connected in parallel to an alternating voltage source to be rectified; and FIG. 2 illustrates more particularly the current flow characteristics in the paralleled silicon semiconductor diode components in three different cases involving different relationships as between the respective avalanche voltages of the parallel connected diode components.

With reference now to FIG. 1, this view illustrates in graph form the current flow in two diodes connected in parallel, during the turn-on period up to $t_1$, during the actual conductive period from $t_1$ to $t_2$ and during the turn-off period following $t_2$. During the turn-on period, i.e. with great current change, the inductive conditions are effective, but the current differences existing at the end of the turn-on period at $t_1$ are compensated in part during the actual conductive period from $t_1$ to $t_2$. During the turn-off period, a current first passes through zero in the components with high mean load, and then cuts off. The components with the highest backwards current peaks will accordingly, as has already been stated, lie where the current distributon curve in the forwards direction has its minimum. After the cut off of the reverse current in the components last to block, the voltage via the branch can rise to the avalanche voltage of the diodes. The components last to block can partly turn the large reverse current again to adjacent components, but nevertheless are stressed by high pulse power inputs. By the selection, in accordance with the invention, of the avalanche voltage — i.e. by arranging the semiconductor component with the highest avalanche voltage at the current branch with the lowest forward current — this pulse power input can be kept low, and it can even be obtained that in the components which are loaded to the greatest extent as regards pulse power input, no avalanche current flows at all. The current is rather formed more completely by minor charge carriers i.e. storage charge, which during the current cut-off period reach the barrier layer.

FIG. 2, which gives an example of two surge voltage resistant silicon diode components 1, 2 connected in parallel between an alternating current source 3 and a load 4, and without the use of short circuiting capacitors for protection, shows how the pulse current in the backwards direction can be turned away to the component 2 in the component 1 which is last to block current. For explanation of the figure the following details are given: in the parallel circuit diagrams shown on the right, the avalanche voltages of the two diodes 1 and 2 are referenced $U_1$ and $U_2$ respectively. Correspondingly, $i_1$ and $i_2$ indicate the forward current in the diode component 1 which is last to block and in the diode component 2 which is first to block, and R is the differential inner resistance of the diode components in the backward direction. Furthermore, $i$ is the maximum backwards current in the diode component 1 and in the branch, $i_z$ the backwards current in the branch, $i_a$ the ideal cut-off current of the diode component which at the differential inner resistance R causes no voltage drop.

The current flow graphs illustrated on the left show the conditions which obtain for three different cases A, B and C. In case A, the two avalanche voltages $U_1$ and $U_2$ are equal. In case B, $U_1 < U_2$ and in case C $U_1 > U_2$.

The reverse current in the semiconductor element which is blocking last (e.g. in case of two diodes connected in parallel) in the time interval considered (that is to say a short time after the conducting phase) is composed of the avalanche current and the minority carrier current. The current carriers of the minority carrier current are p-type holes having diffused into the n-type layer during the preceding conducting phase and now available in the direction np. The possible current (represented by the number of p-type holes getting by diffusion per time unit from the n-type layer into the blocking layer) is characterized in the diagrams by $i_a$ (idealized). If the actual current is just equal to $i_a$, the voltage across the diode is indefinite. If the actual current is smaller than $i_a$, then the voltage across the diode is in the order of magnitude of the voltage drop in the conducting direction. If the actual current is larger than $i_a$, the voltage across the diode is in the order of magnitude of the avalanche voltage.

In the diagrams of FIG. 2 $i_z$ further depicts the reverse current flowing in the branch (in this case diode 1 and diode 2). At the moment "zero" $i_z$ equals the reverse current of the element blocking last. With regard to its magnitude and time function $i_z$ is determined in the first place by the driving voltage and the inductance of the circuit when $t$ is $< 0$, and by the circuit inductance and the avalanche voltages of the diodes when $t$ is $> 0$.

At the moment zero there is always attained the point in which the reverse current $i_z$ required by the circuit is still furnished by the minority carrier current $i_a$. At any moment when $t$ is $> 0$ an avalanche current must flow through diode 1 or diode 2, and a voltage which is at least of the magnitude of $U_1$ or $U_2$ is developed across the circuit.

The three diagrams demonstrate how (by means of correct or erroneous choice of $U_1$ and $U_2$) the one element blocking last (diode 1) can be discharged from transient avalanche power or additionally charged by transient avalanche power. The diode $D_2$ carries exclusively avalanche current in any case.

In case A) ($U_1 = U_2$) the current is composed of $i_a$ . . . minority carrier current and $i_1 - i_a = i_2$.. avalanche current The transient avalanche power is equal for both the diodes, the diode $D_1$ is additionally charged by a minority carrier transient power caused by $i_a$.

In case B) ($U_1 < U_2$) the diode 2 can carry an avalanche current not earlier than an avalanche current of the magnitude $(U_2 - U_1)/R$ is flowing through diode 1.

This current just equals the difference ΔI of the avalanche currents if $i_a = 0$. Particularly in case of a small R the avalanche current in diode 1 is essentially larger than in diode 2, and there is further added the minority carrier transient power.

In case C) ($U_2 > U_1$) there cannot flow any avalanche current in diode 1 if $U_1 - U_2$ is smaller than $R \cdot i_2$ at any moment, because in this case the avalanche voltage $U_1$ is not attained at all. Only minority carrier current flows in diode 1, and this current is just the possible current $i_a$. Hence $D_1$ is completely discharged from transient avalanche power and carries only minority carrier current.

I claim:

1. In a rectifier circuit comprising many branch circuits connected in parallel and wherein silicon semiconductor components having inherently different avalanche voltage characteristics are utilized respectively in the branch circuits, the method of protecting said semiconductor components against carrier dynamic overvoltages arising during the commutation period which comprises the steps of:

measuring the respective mean values of the currents flowing in the various branch circuits in the forward direction through the semiconductor components to determine in which of said branches the mean forward current has the lowest value, selecting the particular semiconductor component with the highest avalanche voltage characteristic, and placing the said selected semiconductor component in the particular branch circuit in which the mean forward current flow has the lowest value.

* * * * *